United States Patent [19]

Traskos et al.

[11] Patent Number: 5,329,695
[45] Date of Patent: Jul. 19, 1994

[54] METHOD OF MANUFACTURING A MULTILAYER CIRCUIT BOARD

[75] Inventors: Richard T. Traskos, Brooklyn, Conn.; John A. Olenick, Brockport, N.Y.

[73] Assignee: Rogers Corporation, Rogers, Conn.

[21] Appl. No.: 999,494

[22] Filed: Dec. 31, 1992

Related U.S. Application Data

[63] Continuation-in-part of Ser. No. 939,105, Sep. 1, 1992.

[51] Int. Cl.[5] .............................................. H05K 3/36
[52] U.S. Cl. ........................................ 29/830; 29/852; 156/89; 156/902; 264/61
[58] Field of Search ................ 29/830, 852; 156/89, 156/902; 264/61

[56] References Cited

U.S. PATENT DOCUMENTS

| | | |
|---|---|---|
| 3,835,531 | 9/1974 | Luttmer . |
| 3,953,924 | 5/1976 | Zachry et al. . |
| 4,075,757 | 2/1978 | Malm et al. . |
| 4,566,186 | 1/1986 | Bauer et al. ............... 29/830 X |
| 4,634,631 | 1/1987 | Gazit et al. . |
| 4,647,508 | 3/1987 | Gazit et al. . |
| 4,740,414 | 4/1988 | Shaheen ..................... 156/89 X |
| 4,788,766 | 12/1988 | Burger et al. . |
| 4,799,983 | 1/1989 | Desai ........................ 156/89 |
| 4,818,728 | 4/1989 | Rai et al. . |
| 4,849,284 | 7/1989 | Arthur et al. . |
| 4,868,350 | 9/1989 | Hoffarth et al. . |
| 4,874,721 | 10/1989 | Kimura et al. . |
| 4,902,606 | 2/1990 | Patraw . |
| 5,006,182 | 4/1991 | Gantzhorn, Jr. et al. ...... 156/89 |
| 5,030,499 | 7/1991 | Shaheen et al. . |
| 5,046,238 | 9/1991 | Daigle et al. . |
| 5,152,868 | 10/1992 | Schiltz et al. .............. 156/902 X |

FOREIGN PATENT DOCUMENTS

| | | | |
|---|---|---|---|
| 54-3270 | 1/1979 | Japan ........................ 156/89 |
| 62-108987 | 6/1987 | Japan . |

OTHER PUBLICATIONS

PCT/US86/01176 Method of Manufacturing Printed Circuit Boards Jan. 1987.

*Primary Examiner*—Carl J. Arbes
*Attorney, Agent, or Firm*—Fishman, Dionne & Cantor

[57] ABSTRACT

Methods of fabricating multilayer circuits are presented. In accordance with the present invention, a plurality of circuit layers are stacked, one on top of the other. At least one of the circuit layers comprise a substrate composed of a polymeric material capable of undergoing bonding such as a fluoropolymeric based substrate having vias therethrough and a circuit comprised of a layer of suitable conductive material. A fusible conductive bonding material (e.g., solder) or a noble metal is applied wherever electrical connections are desired. At least one other of the circuit layers comprises a cofired multilayer ceramic circuit having vias and circuits comprised of a layer of suitable conductive material with a fusible conductive bonding material (e.g., solder) or a noble metal applied wherever electrical connections are desired. Once stacked the circuits are subjected to lamination under heat and pressure to adhere each polymeric substrate to an adjacent ceramic substrate and to diffuse the noble metal or fuse the solder layers together to form an integral multilayer circuit having solid conductive interconnects.

49 Claims, 9 Drawing Sheets

METHOD OF MANUFACTURING A MULTILAYER CIRCUIT BOARD

CROSS-REFERENCE TO RELATED APPLICATION

This is a continuation-in-part of copending U.S. Aaplication Ser. No. 939,105 filed on Sep. 1, 1992. A related U.S. application is entitled Method of Manufacturing A Multilayer Circuit Board invented by Richard T. Traskos et al is filed contemporaneously herewith, now U. S. patent application Ser. No. 07/999,493.

TECHNICAL FIELD

This invention relates generally to methods of manufacturing multilayer circuit boards and multichip modules. More particularly, this invention relates to new and improved methods of manufacturing multilayer circuits wherein interconnections between circuit layers may be accomplished in a single fusion bonding lamination step utilizing a fusible conductive material (e.g. solder) or a diffusible conductive material (e.g. a noble metal) and a plurality of circuit layers, at least one of which is a cofired ceramic circuit. In a preferred embodiment, the bonding is accomplished without the need for intermediate bonding plies. Further, this process allows a full range of interconnection and design rules without the need for sequential fabrication, which can significantly reduce process cost by improving yield and decreasing cycle time.

BACKGROUND OF THE INVENTION

Multilayer circuits are well known and comprise a plurality of stacked substrate/circuit trace assemblies with interconnections between selected locations on the spaced circuit traces. Conventional manufacturing techniques for multilayer circuits generally do not yield multiple levels of interconnect. This limits the circuit density and the number of substrates. When high density, multiple interconnect levels are required, step intensive sequential process techniques are usually utilized. Such processing can drastically reduce yields.

U.S. Pat. No. 4,788,766 attempts to overcome these problems. This prior art patent discloses a method wherein a multilayer assembly is made up of a number of individual circuit boards and each board has conductive layers formed on opposing surfaces. The substrate is a dielectric material which insulates the conductive layers. Via holes are formed through the first conductive layer, the substrate and the second conductive layer at various locations. An outer conductive material, such as copper, is applied over the first and second conductive bonding layers and onto the side walls of the holes. A conductive bonding material is then deposited onto the outer conductive material in the areas around the holes. Once the individual boards have been fabricated, they are stacked in a predetermined order and orientation with a suitable low temperature dielectric bonding ply (meaning that the bonding ply has a lower softening temperature than the circuit substrate material) positioned between each pair of layers. The dielectric bonding ply requires registered apertures therethrough which correspond to areas where the conductive layers of one substrate is to make an electrically conductive connection with the conductive layer of an adjacent substrate. Thus, the dielectric bonding ply integrally bonds adjacent boards together while providing electrical isolation and/or electrical connections between conductive layers of different boards. The assembly of boards is then subjected to a cycle of heat and pressure to effect a bond between the various board layers.

While the method of U.S. Pat. No. 4,788,766 overcomes some of the problems in the prior art, this prior art method has certain disadvantages including the requirement for a substrate which has a melting temperature above the melting temperature of the bonding ply. In other words, the prior patent necessitates the use of a low temperature bond ply which limits the thermal rating of the multilayer circuit. In addition, this prior method necessitates registered apertures in the bonding ply (leading to alignment problems) and is limited to multilayer circuits having plated through holes.

U.S. Pat. No. 5,046,238, assigned to the assignee hereof and incorporated herein by reference, attempts to overcome these problems. This prior art patent discloses a method wherein a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. Fusible conductive bonding material (e.g., solder) is applied on selected exposed circuit traces (prior to the stacking step) whereupon the entire stack is subjected to lamination under heat and pressure to simultaneously fuse all of the substrate and conductive layers together to form an integral multilayer circuit having solid conductive interconnects.

In the first embodiment of U.S. Pat. No. 5,046,238, the discrete circuit layers are each prepared by (1) forming traces and pads on a removable mandrel; (2) laminating a layer of dielectric to the circuit and mandrel; (3) forming an access opening at selected locations through the dielectric layer (using laser, plasma, ion etch or mechanical drilling techniques) to expose selected circuit locations; (4) forming conductive posts in the access openings to a level below the top of the access openings; and (5) providing a fusible conductive material in the access opening. Thereafter, a stack-up is made of a plurality of these discrete circuit layers so that the exposed fusible conductive material contacts selected locations on an adjacent circuit. This stack-up is then subjected to heat and pressure to simultaneously fuse both the several layers of dielectric substrate and fusible conductive material to provide a cohesive fused multilayer circuit board.

In the second embodiment of U.S. Pat. No. 5,046,238, at least one discrete circuit board is made using any suitable technique to define a fusible dielectric substrate having a circuit pattern thereon. Next, a layer of fusible dielectric material having openings through selected locations is placed on the circuit board so that selected locations on the circuit pattern are exposed. Thereafter, a plug of fusible conductive material (e.g., solder) is placed in the openings (using manual, mechanical or like techniques). Next, a second circuit board is stacked on the first board so that the plugs of fusible conductive material align with and contact selected locations on the circuit pattern of the second circuit board. This stack-up is then subjected to heat and pressure to simultaneously fuse both the layers of fusible dielectric and the fusible conductive material to provide a cohesive fused multilayer circuit board.

While the method of U.S. Pat. No. 5,046,238 overcomes some of the problems in the prior art, this prior art method has certain disadvantages including problems commonly encountered with spreading of the solder mass during lamination, and evolution of the flux medium necessary to deoxidize the solder. Further, spreading of the solder mass is dependent on the low viscosity of the solder, the amount of solder and the proximity of other circuit features. Also, it is difficult to evolve all of the flux compound from the internal layers of the printed circuit board thereby presenting a potential long-term reliability problem from residual organics. With continued microminiaturization of circuit features, it is desired to produce circuit boards with feature sizes smaller than that possible using solder.

In addition, the multilayer structures made completely with the fusible dielectric may suffer from one or more of the following deficiencies:

(1) too soft, which leads to handling, rework and wire bondability problems;
(2) too expensive because of the expense of the fusible dielectric; and
(3) too low in thermal conductivity, which can restrict use in applications where heat management and removal are required.

SUMMARY OF THE INVENTION

The above-discussed and other problems and deficiencies of the prior art are overcome or alleviated by the methods of fabricating multilayer circuits of the present invention. In accordance with the present invention, a plurality of circuit layers are stacked, one on top of the other. At least one of the circuit layers comprise a substrate composed of a polymeric material capable of undergoing bonding such as a fluoropolymeric based substrate having vias therethrough and a circuit comprised of a layer of suitable conductive material. A fusible conductive bonding material (e.g., solder) or a diffusible conductive bonding material (e.g., a noble metal) is applied wherever electrical connections are desired. In accordance with a first method of the present invention, at least one other of the circuit layers comprises a cofired multilayer ceramic circuit having vias and circuits comprised of a layer of suitable conductive material. A fusible conductive bonding material (e.g., solder) or a diffusible conductive bonding material (e.g., a noble metal) is applied wherever electrical connections are desired. Once stacked the circuits are subjected to lamination under heat and pressure to adhere each polymeric substrate to an adjacent cofired ceramic substrate (or to an adjacent fusible polymeric substrate) and to diffuse the noble metal or fuse the solder layers together to form an integral multilayer circuit having solid conductive interconnects. In accordance with a second method of the present invention, at least one other of the circuit layers comprises a polyimide circuit (or other high temperature, non fusing polymer based circuit) having vias and circuits comprised of a layer of suitable conductive material. A fusible conductive bonding material (e.g., solder) or a diffusible conductive bonding material (e.g., a noble metal) is applied wherever electrical connections are desired. Once stacked the circuits are subjected to lamination under heat and pressure to adhere each polymeric substrate to an adjacent polyimide substrate (or to an adjacent fusible polymer substrate) and to diffuse the noble metal or fuse the solder layers together to form an integral multilayer circuit having solid conductive interconnects. With noble metals, in both methods, it may also be necessary, depending on conductive metal and noble metal combinations, to include a barrier metallization (i.e., nickel) to prevent diffusion of the conductive metal into the noble metal. Barrier metals are not required if both circuit layers and vias are comprised of noble metal or when solder is used as the fusible conductive material.

In a first embodiment of the present invention, each fusible circuit layer is prepared by (1) forming traces and pads on a removable mandrel; (2) laminating a layer of fusible dielectric material (e.g., a polymeric material) to the circuit and mandrel; (3) forming an access opening at selected locations through the fusible dielectric layer (using laser, plasma, ion etch or mechanical drilling techniques) to expose selected circuit locations; (4) forming conductive posts in the access openings to a level below the top of the access openings; and (5) providing a fusible conductive material (e.g., solder) in the access opening.

Each cofired multilayer ceramic circuit comprises one or more individual ceramic circuit layers. The ceramic circuit layers are each prepared by (1) punching or drilling a hole pattern in a ceramic tape, the hole pattern corresponding to the vias of a desired circuit pattern, the ceramic tape comprising about 60–70% ceramic (e.g., alumina) and about 40–30% respectively organic binder; (2) depositing a tungsten/glass composition in the holes; and (3) screen printing (using a conductive ink e.g., tungsten-based) the circuit pattern onto the ceramic. Thereafter, one or more of these ceramic circuit layers are stacked and cofired, e.g., at about 1600° C. for about 5–6 hours as is known in the art. During cofiring of the stack of ceramic circuit layers the organic binders in the ceramic tape are burned out with primarily the ceramic remaining. The cofired stack of ceramic circuit layers defines the cofired multilayer ceramic circuit. A layer of chrome is deposited on the exposed vias with a layer of conductive material (e.g., copper) deposited on the layer of chrome. The layer of chrome acts as an adhesion promotor which allows the copper to bond to the tungsten in the vias and to the ceramic.

Thereafter, a stack-up is made of these circuits (i.e., the fusible circuits and the cofired ceramic circuits) so that the exposed fusible conductive material contacts selected locations on an adjacent circuit. This stack-up is then subjected to heat and pressure to adhere the fusible material with adjacent ceramic material and to fuse the fusible conductive material to provide a cohesive fused multilayer circuit board. Further, if adjacent polymeric circuits are present then the polymeric material from these adjacent circuits will fuse together during the application of heat and pressure.

In a second embodiment of this invention, a first cofired multilayer ceramic circuit board is made using any suitable technique and has a circuit pattern. Next, a layer of fusible dielectric material (e.g., a polymeric material) having openings through selected locations is placed on the circuit board so that selected locations on the circuit pattern are exposed. Thereafter, a plug of fusible conductive material (e.g. solder) is placed in the openings (using manual, mechanical or like techniques). Next, a second cofired multilayer ceramic circuit board is stacked on the polymeric material so that the plugs of fusible conductive material align with and contact selected locations on the circuit pattern of the second circuit board. This stack-up is then subjected to heat and pressure to simultaneously adhere the layer of fusible dielectric to both layers of ceramic and to fuse the fusible conductive material to provide a cohesive fused multilayer circuit board.

In a third embodiment of the present invention, each fusible circuit layer is prepared by (1) forming traces and pads on a removable mandrel (e.g., copper) with a thin nickel barrier layer, these traces and pads comprising a layer of noble metal, a nickel barrier and a suitable conductive material (e.g., copper); (2) laminating a layer of fusible dielectric material to the circuit and mandrel; (3) forming an access opening at selected locations through the fusible dielectric layer (using laser, plasma, ion etch or mechanical drilling techniques) to expose selected circuit locations; and (4) forming conductive posts in the access openings to the top of the access openings, the conductive post comprising a layer of a suitable conductive material, a layer of nickel deposited on the layer of conductive material and a layer of a noble metal (e.g., gold).

Each cofired multilayer ceramic circuit comprises one or more individual ceramic circuit layers. The ceramic circuit layers are each prepared by (1) punching or drilling a hole pattern in a ceramic tape, the hole pattern corresponding to the vias of a desired circuit pattern, the ceramic tape comprising about 60–70% ceramic (e.g., alumina) and about 40–30% respectively organic binder; (2) depositing a tungsten/glass composition in the holes; and (3) screen printing (using a conductive ink e.g., tungsten-based) the circuit pattern onto the ceramic. Thereafter, the ceramic circuit layers are stacked and cofired at, e.g., 1600° C. for about 5–6 hours as is known in the art. During cofiring of the stack of ceramic circuit layers the organic binders in the ceramic tape are burned out with primarily the ceramic remaining. The cofired stack of ceramic circuit layers define the cofired multilayer ceramic circuit. A layer of chrome is deposited on the exposed vias with a layer of conductive material (e.g., copper) deposited on the layer of chrome. The layer of chrome acts as an adhesion promotor which allows the copper to bond to the tungsten in the vias and to the ceramic. A layer of nickel is deposited on the layer of conductive material with a layer of a noble metal (e.g., gold) deposited on the layer of nickel.

Thereafter, a stack-up is made of these circuits (i.e., the fusible circuits and the cofired multilayer ceramic circuits) so that the exposed fusible conductive material contacts selected locations on an adjacent circuit. This stack-up is then subjected to heat and pressure to adhere the fusible material with adjacent ceramic material and to diffuse the noble metal to provide a cohesive fused multilayer circuit board. Further, if adjacent polymeric circuits are present then the polymeric material from these adjacent circuits will fuse together during the application of heat and pressure.

In a fourth embodiment of this invention, a first cofired ceramic circuit board is made using any suitable technique and has a circuit pattern. Next, a layer of fusible dielectric material (e.g., a polymeric material) having openings through selected locations is placed on the circuit board so that the selected locations on the circuit pattern are exposed. The multilayer ceramic circuit has at selected exposed vias a layer of chrome deposited thereat, a layer of conductive material deposited on the layer of chrome, a layer of nickel deposited on the layer of conductive material, and a layer of a noble metal deposited on the layer of nickel. Next, a second cofired multilayer ceramic circuit board is stacked on the polymeric material so that selected locations of the noble metal on the first circuit board align with and contact selected locations of the noble metal on the second circuit board. This stack-up is then subjected to heat and pressure to simultaneously adhere the layer of fusible dielectric to both layers of ceramic and to diffuse the noble metal to provide a cohesive fused multilayer circuit board.

In a fifth embodiment of this invention, a first non-fusing polyimide film circuit board is made using any suitable technique and has a circuit pattern thereon. Next, a layer of fusible dielectric material (e.g. a polymeric material) having openings through selected locations on the circuit board so that selected locations is placed on the circuit pattern are exposed. Thereafter, a plug of fusible conductive material (e.g. solder) is placed in the openings (using manual, mechanical or like techniques). Next, a second non-fusing polyimide film circuit board is stacked on the polymeric material so that the plugs of fusible conductive material align with and contact selected locations on the circuit pattern of the second circuit board. This stack-up is then subjected to heat and pressure to simultaneously adhere the layer of fusible dielectric to both layers of polyimide and to fuse the fusible conductive material to provide a cohesive fused multilayer circuit board.

In a sixth embodiment of this invention, a first non-fusing polyimide film circuit board is made using any suitable technique and has a circuit pattern thereon. Next, a layer of fusible dielectric material (e.g., a polymeric material) having openings through selected locations is placed on the circuit board so that the selected locations on the circuit pattern are exposed. The circuit comprising at selected locations a layer of a suitable conductive material, a layer of nickel deposited on the layer of conductive material and a layer of noble metal (e.g., gold) deposited on the layer of nickel. Next, a second non-fusing polyimide film circuit board is stacked on the polymeric material so that selected locations of the noble metal on the first circuit board align with and contact selected locations of the noble metal on the second circuit board. This stack-up is then subjected to heat and pressure to simultaneously adhere the layer of fusible dielectric to both layers of polyimide and to diffuse the noble metal to provide a cohesive fused multilayer circuit board.

It will be appreciated that the non-fusing polyimide film could be replaced by any polymer-based film or laminate which can be processed into circuits and which can withstand the dielectric conductor fusing process. For example, polyimide filled with fabric or filler, such as polyimide/glass cloth laminates.

All of the foregoing embodiments provide important features and advantages relative to prior art multilayer circuit fabrication techniques including lower manufacturing costs and increased circuit density. The multilayer ceramic circuits are typically used for power distribution, polymeric circuits are not well suited for power distribution. Also the ceramic adds rigidity and heat sinking to the circuit. The non-fusing polyimide film is more suitable for wire bonding applications than a fluoropolymer circuit. Rework of an integrated circuit which is bonded to a fluoropolymer circuit often results in damage to the circuit due to the softness of the fluoropolymer layer. However, rework of an integrated circuit which is bonded to a polyimide circuit does not damage the circuit because of the high modulus of the polyimide circuit. The polyimide circuit also can be very thin, e.g., 1 mil; this has advantages in removing heat through this circuit layer.

The above-discussed and other features and advantages of the present invention will be appreciated and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The present invention relates generally to methods wherein a plurality of circuit layers are stacked, one on top of the other. At least one of the circuit layers comprise a substrate composed of a polymeric material capable of undergoing bonding such as a fluoropolymeric based substrate having vias therethrough and a circuit comprised of a layer of suitable conductive material. A fusible conductive bonding material (e.g., solder) or a diffusible conductive bonding material (e.g., a noble metal) is applied wherever electrical connections are desired. In accordance with a first method of the present invention, at least one other of the circuit layers comprises a cofired ceramic circuit having vias and circuits comprised of a layer of suitable conductive material. A fusible conductive bonding material (e.g. solder) or diffusible conductive bonding material (e.g., a noble metal) is applied wherever electrical connections are desired. Once stacked the circuits are subjected to lamination under heat and pressure to adhere each polymeric substrate to an adjacent ceramic substrate and to diffuse the noble metal or fuse the solder layers together to form an integral multilayer circuit having solid conductive interconnects. In accordance with a second method of the present invention, at least one other of the circuit layers comprises a polyimide circuit having vias and circuits comprised of a layer of suitable conductive material. A fusible conductive bonding material (e.g., solder) or a diffusible conductive bonding material (e.g., a noble metal) is applied wherever electrical connections are desired. Once stacked the circuits are subjected to lamination under heat and pressure to adhere each polymeric substrate to an adjacent polyimide substrate and to diffuse the noble metal or fuse the solder layers together to form an integral multilayer circuit having solid conductive interconnects.

Examples of suitable fusible dielectric substrates include fluoropolymer based substrate materials such as PTFE or the fluoropolymeric, substrates described in U.S. Pat. Nos. 4,335,180; 4,634,631; 4,647,508; or 4,849,284 (all of which are assigned to the assignee hereof and fully incorporated herein by reference). Examples of commercially available dielectric substrates suitable for the present invention include the materials sold under the tradenames RT/DUROID and RO-2800, both of which are available from Rogers Corporation assignee of the present application. Examples of suitable fusible conductive material includes metals and metal alloys with a melting point of less than 900° F. A specific example of such a fusible material is a solder composition of 60% tin and 40% lead.

Figure 1:
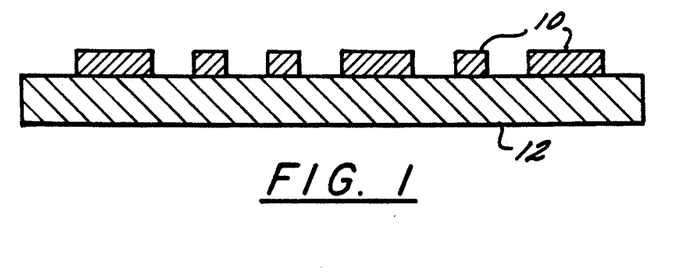
FIGS. 1-5 are sequential cross-sectional elevational views showing the fabrication of a discrete circuit board layer in accordance with the first embodiment of the present invention.
Figure 2:
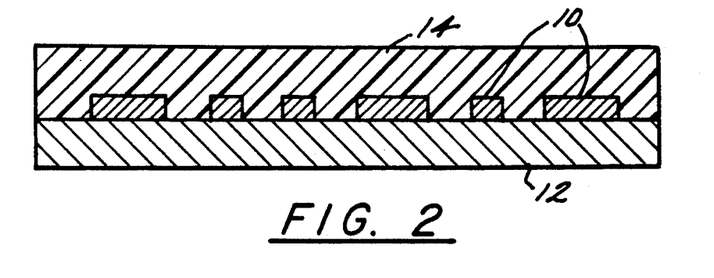
Figure 3:
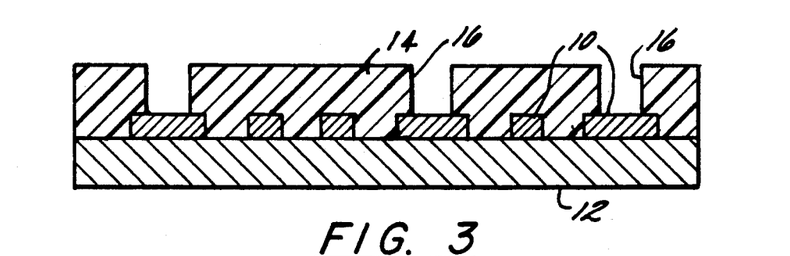
Figure 4:
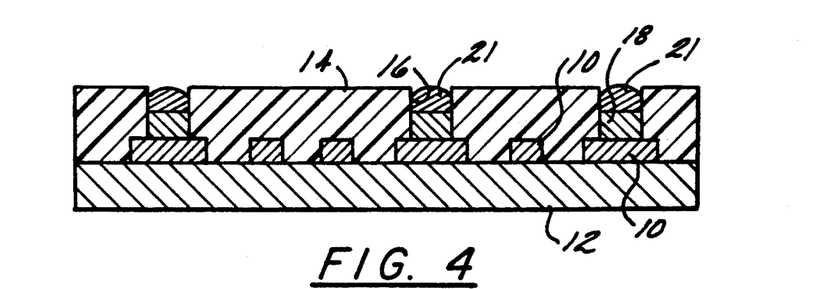
Figure 5:
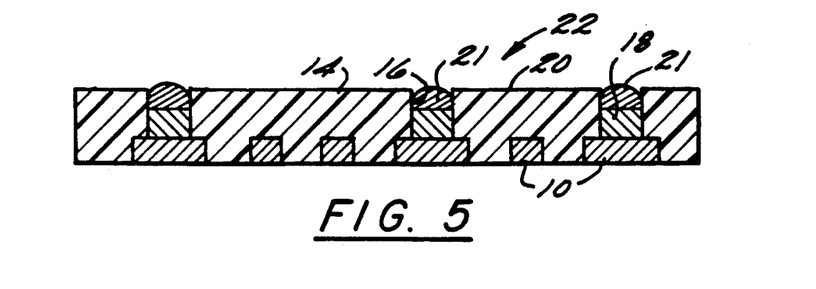

Referring now to FIGS. 1-7 a circuit having a fusible dielectric layer is formed in accordance with the method taught in U.S. Pat. No. 5,046,238 wherein the first step shown in FIG. 1 a pattern 10 of circuit traces and pads is formed on a suitable mandrel 12. The pattern may be comprised of any suitable conductive material such as copper or aluminum and may be formed on mandrel 12 by any suitable method such as electroless plating, electroplating or vapor deposition. Mandrel 12 is preferably comprised of copper or other metal. Next, as shown in FIG. 2, a layer of dielectric material 14 is laminated over circuit 10 and mandrel 12. Thereafter, access openings 16 are provided through dielectric layer 14 at selected locations to access the pads or traces 10 (see FIG. 3). Access openings 16 may be formed using any known means such as laser, plasma, ion etch or mechanical drilling techniques. One particularly well suited technique is the laser etching methodology described in U.S. Pat. No. 4,915,981 which is assigned to the assignee hereof and incorporated herein by reference.

After the access openings 16 have been formed (see FIG. 4) conductive posts 18 are formed within access openings 16 so as to completely fill openings 16 to a level just below the top surface 20 of dielectric layer 14. Still referring to FIG. 4, in the next step, a conductive fusible material such as solder is disposed in the remaining portion of access opening 16 so as either to be level with top surface 20 or extend slightly thereover. In the final step of forming a discrete circuit layer, the mandrel 12 is removed from the circuit and dielectric using any suitable removal method such as known etching techniques. The resulting circuit layer is thus shown a 22 in FIG. 5.

Figure 6:
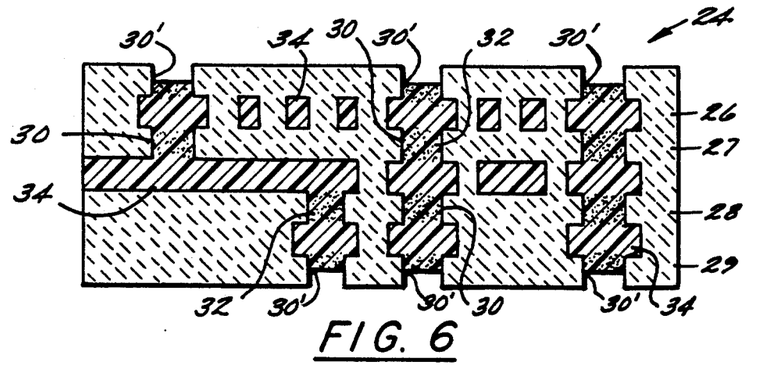
FIG. 6 is a cross-sectional elevational view of a cofired multilayer ceramic circuit in accordance with the present invention.
Figure 7:
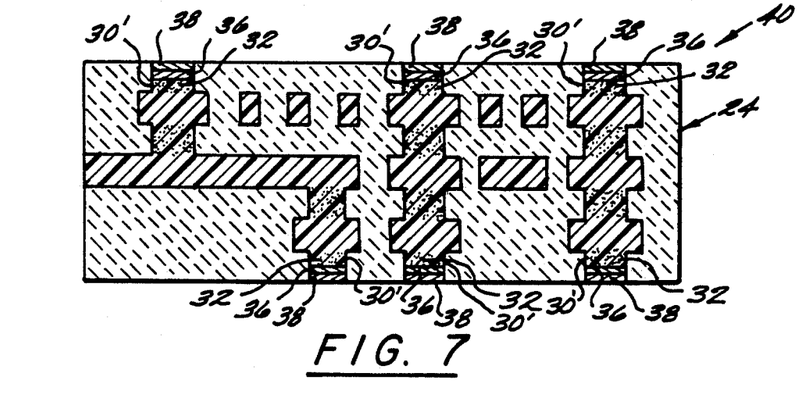
FIG. 7 is a cross-sectional elevational view of a cofired multilayer ceramic circuit of FIG. 6 with an exposed layer of conductive material, FIG. 8 an exploded view depicting a stack-up of circuit boards of the type shown in FIGS. 5 and 7.

Referring to FIG. 6 a cofired multi layer ceramic circuit is shown generally at 24. Circuit 24 may be formed using any known technique. For example, a cofired multilayer ceramic circuit 24 comprises a plurality of individual ceramic circuit layers 26-29. The ceramic circuit layers are each prepared by (1) punching or drilling a hole pattern corresponding to the vias 30 of a desired circuit pattern, the ceramic tape comprising about 60-70% ceramic (e.g., alumina ) and about 40-30% respectively organic binder; (2) depositing a tungsten/glass composition 32 in the holes 30; and (3) screen printing (using a conductive ink e.g., tungsten-based) the circuit pattern 34 onto the ceramic. Thereafter a plurality of these ceramic circuit layers 26-29 are stacked and cofired at, e.g., 1600° C., for about 5-6 hours as is known in the art. During cofiring of the stack of ceramic circuit layers 26-29 the organic binders in the ceramic tape are burned out with the ceramic remaining. The cofired stack of ceramic circuit layers 26-29 define the cofired multilayer ceramic circuit 24. It is an important feature of the present invention that the exposed vias 30' be only partially filled with the tungsten/glass composition 32. Thereby permitting a layer of chrome 36 (FIG. 7) to be deposited in the exposed vias 30' on the tungsten/glass composition 32 with a layer of conductive material 38 (e.g., copper) deposited on the layer of chrome 36, forming a circuit 40. The layer of chrome 36 is an adhesive promotor which allows the copper 38 to bond to the tungsten 32 in the vias 30'.

Figure 8:
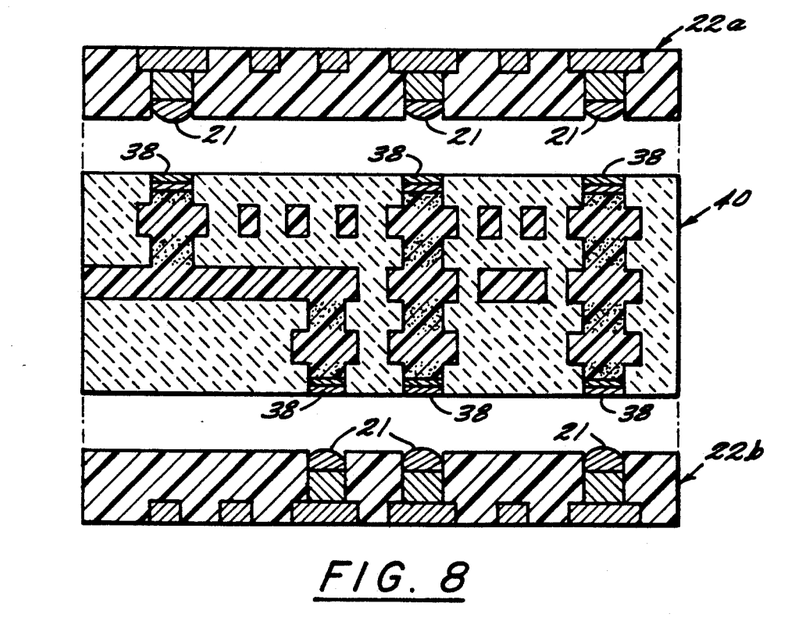

Referring now to FIG. 8 two circuits 22a and 22b which have been fabricated in accordance with the techniques shown in FIGS. 1-5 and cofired multilayer ceramic circuit 40 are stacked with circuit 40 sandwiched between circuits 22a and 22b in the manner shown. Of course, any number of circuits may be stacked and registered with one another such that the fusible conductive material 21 aligns with copper 38 in vias 30' of circuit 40.

After the discrete circuit boards have been stacked up as shown in FIG. 8, the stack up is subjected to lamination under sufficient heat and pressure so as to adhere the fusible material 14 with adjacent ceramic material 26, 29 and to fuse the fusible conductive material 21 and thereby provide an integral and cohesive fused multilayer circuit board 42 (FIG. 9) having solid conductive interconnects.

Figure 9:
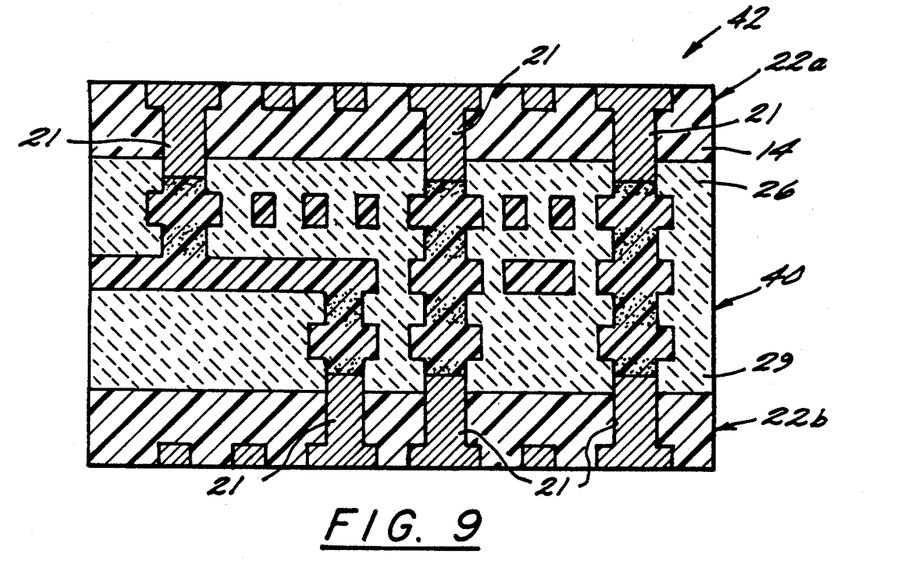
FIG. 9 is a cross sectional elevation view of a final laminated multilayer circuit board made in accordance with the first embodiment of the present invention.
Figure 10:
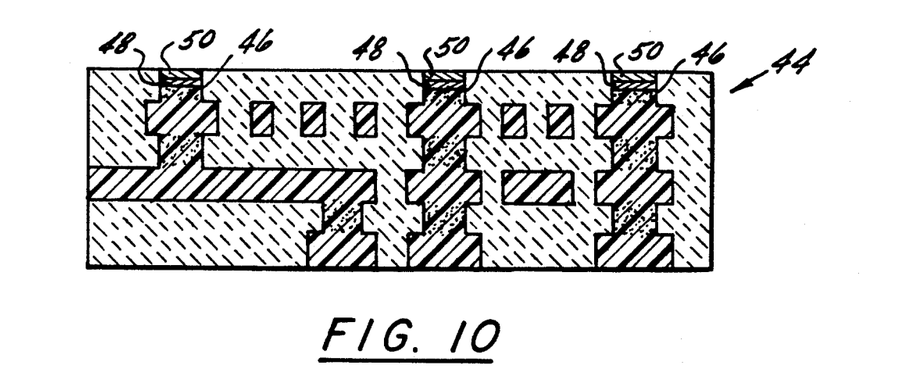
FIGS. 10-14 are cross sectional elevation views depicting a sequential fabrication technique for making multilayer circuit boards in accordance with the second embodiment of the present invention.
Figure 11:
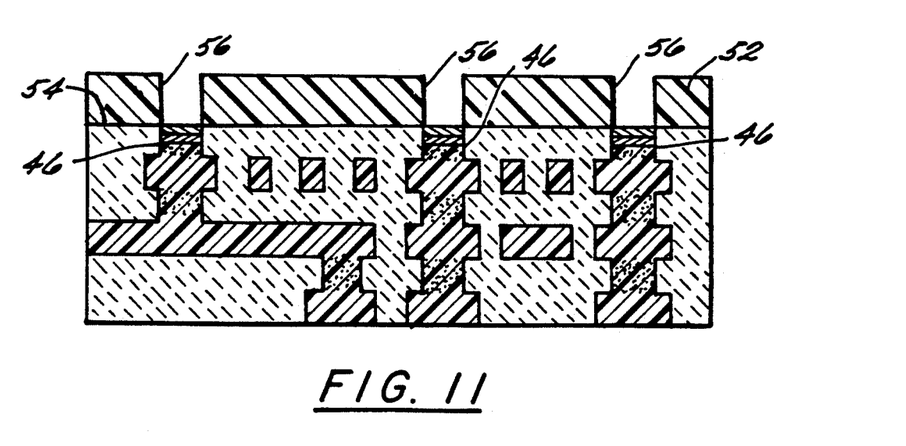

It will be appreciated that several alternative method steps may be utilized in conjunction with the above embodiment of this invention. For example, rather than the additive processing techniques for formation of the circuit traces shown in FIGS. 1-5, known substractive imaging technology may be used to form circuits 10. Also, the fusible interconnect material may be deposited by any known method such as screen printing or by using any other suitable selective placement technology. Also, the fusible metallurgy can be on both contacting surfaces to be fused. In addition, an intermediate bonding film having access openings selectively formed therein may be utilized between discrete circuit layers 22a and 22b. This intermediate bonding film would include the fusible conductive material in the access openings (or on the opposing surfaces of said access opening, with non-fusible conductive material between said opposing surfaces) so that upon lamination under heat and pressure, a final multilayer circuit such as shown in FIG. 9 would result.

Figure 12:
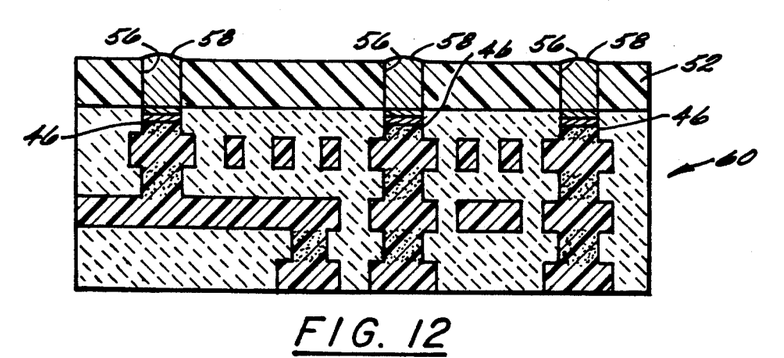

Turning now to FIGS. 10-14, a second embodiment in accordance with the present invention is shown. In this second embodiment, a first cofired multilayer ceramic circuit 44 having exposed vias 46 including a layer of chrome 48 and a layer of a conductive material 50 is formed in accordance with the aforementioned method. In the next step shown in FIG. 11 a layer of fusible dielectric material 52 is provided onto top surface 54 of circuit 44. Layer 52 will include preselected registered openings 56 therethrough which correspond to vias 46 having conductive layer 50. Alternatively, layer 52 may be positioned over circuit 44 with openings 56 formed "in situ" using laser etching or other techniques. Thereafter, fusible conductive plugs 58 are loaded in openings 56 adjacent vias 46 (FIG. 12). Conductive plugs 58 may be positioned within openings 56 using any suitable manual or mechanical means resulting in the circuit assembly identified at 60 in FIG. 12.

Figure 13:
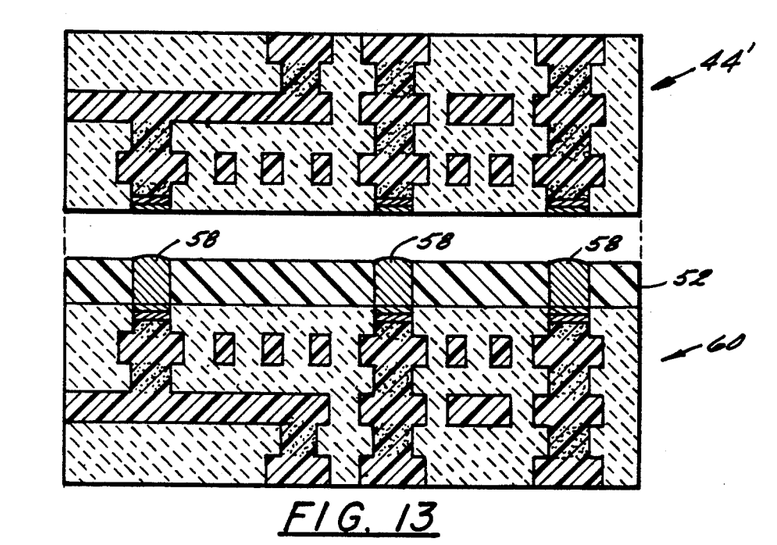
Figure 14:
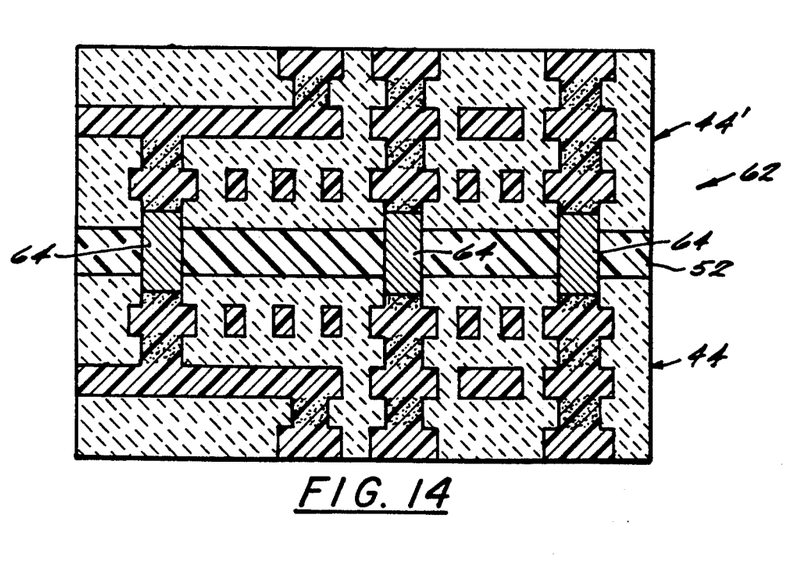
Figure 15:
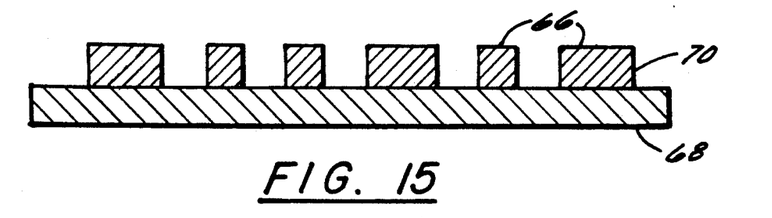
FIGS. 15-19 are sequential cross-sectional elevational views showing the fabrication of a discrete circuit board layer in accordance with the third embodiment of the present invention.

Next, and as shown in FIG. 13, a second circuit 44' is disposed over circuit assembly 60 such that circuits 44' are aligned with and contact fusible conductive material 58. The stack-up in FIG. 13 is then subjected to fusion lamination as described above resulting in the fusion of conductive material 58 with circuits 44 and 44' and the adhesion of dielectric layer 52 and with the ceramic of circuits 44 and 44' to provide a cohesive multilayer circuit board 62 having solid conductive interconnects 64 (see FIG. 14). It will be appreciated that as in the first embodiment, any number of circuits may be stacked to form any desired multilayer circuit configuration.

For both the first and second embodiments of this invention, lamination temperatures and pressures will vary with the composition of the fusible dielectric and conductive material.

Figure 16:
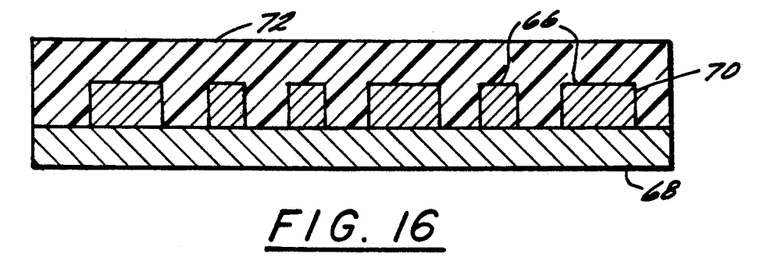
Figure 17:
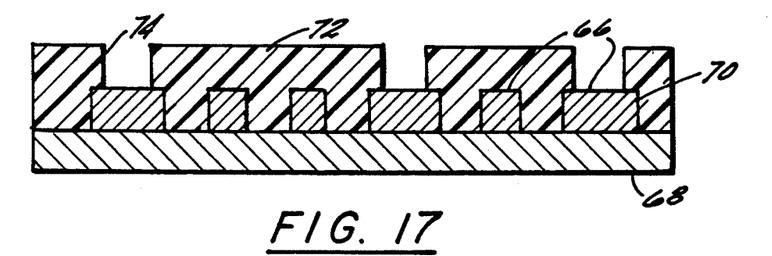
Figure 18:
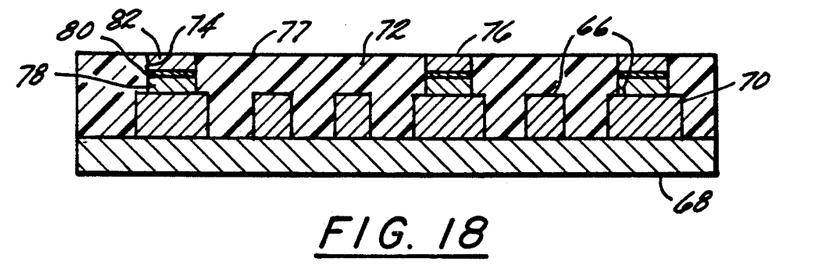
Figure 19:
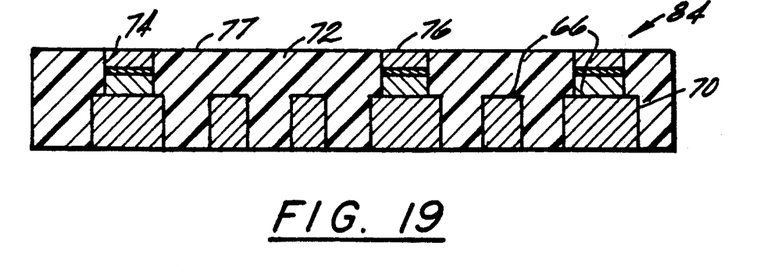

Turning now to FIGS. 15-19, a third embodiment of the present invention will now be described. In the first step shown in FIG. 15, a pattern 66 of circuit traces and pads is formed on a suitable mandrel 68. Circuit 66 is comprised of a layer 70 of a suitable conductive material such as copper or aluminum. Circuit 66 may be formed on mandrel 68 by any suitable method such as electroless plating, electroplating or vapor deposition. Mandrel 68 is preferably comprised of copper or other metal. Next, as shown in FIG. 16 a layer of dielectric material 72 is laminated over circuit 66 and mandrel 68. Thereafter, access openings 74 are provided through dielectric layer 72 at selected locations to access the pads or traces 66 (see FIG. 17). Access openings 74 may be formed using any known means such as laser drilling, plasma etching, ion etching, mechanical drilling techniques, punching or using preformed posts to penetrate the dielectric. One particularly well suited technique is the laser etching methodology described in U.S. Pat. No. 4,915,981.

After the access openings 74 have been formed (see FIG. 18), conductive posts 76 are formed within access openings 74 so as to completely fill openings 74 to be level with a top surface 77 of dielectric layer 72 or extend slightly thereover. Conductive posts 72 are comprised of three layers; a first layer 78 comprises a suitable conductive material such as copper or aluminum which is deposited on circuit 66, a second layer 80 comprises nickel or equivalent which is deposited on layer 78 and a third layer 82 comprises a noble metal (e.g., gold) which is deposited on layer 80. Layer 78 is only a filler, whereby an enlarged nickel or gold layer could be used and layer 78 eliminated. Layer 80 of nickel prevents diffusion of the copper of layer 78 into the gold of layer 82. This diffusion would otherwise degrade the bondability of the gold. In the final step of forming a discrete circuit layer, the mandrel 68 is removed from the circuit and dielectric using any suitable removal methods such as known etching techniques. The final discrete circuit layer is thus shown at 84 in FIG. 19.

Figure 20:
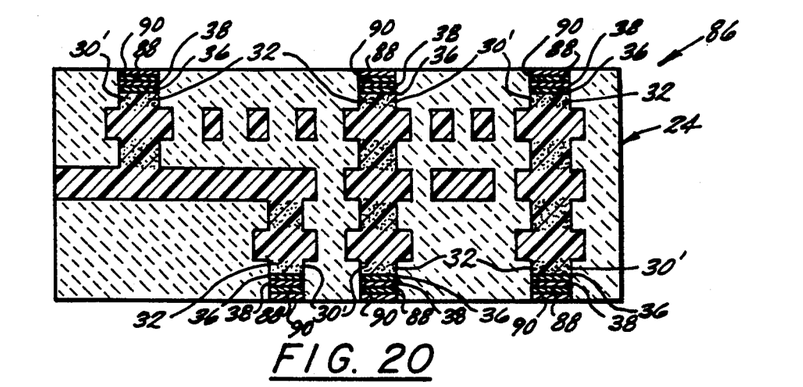
FIG. 20 is a cross-sectional elevational view of a cofired multilayer ceramic circuit in accordance with the present invention.

A cofired multilayer ceramic circuit in accordance with FIG. 6 of the first embodiment is formed. Referring to FIG. 20 a cofired multilayer ceramic circuit in accordance with this embodiment is shown generally at 86 wherein common elements to the FIG. 6 circuit are numbered alike. The only differences between circuit 86 and circuit 40 (FIG. 6) are the additional layers at the exposed vias 30'. More specifically, a layer 88 comprised of nickel or equivalent is deposited on layer 38 and a layer 90 comprised of a noble metal (e.g. gold) is deposited on layer 88.

Figure 21:
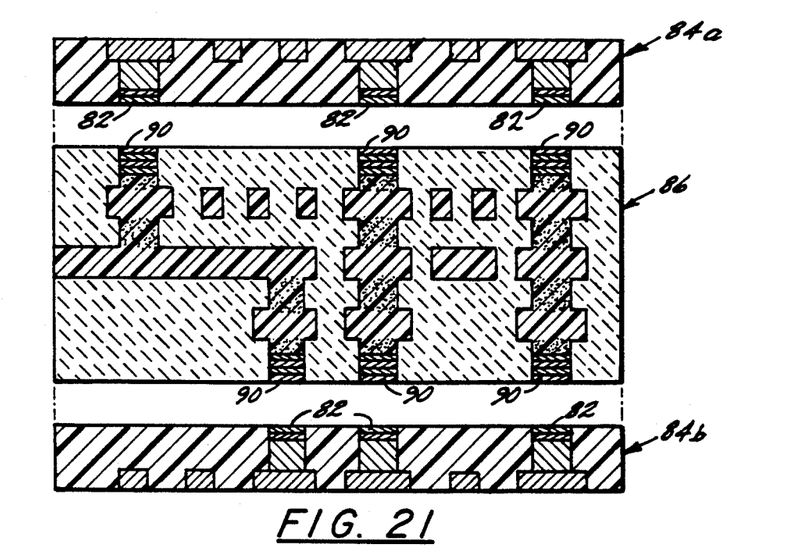
FIG. 21 is an exploded view depicting a stack-up of circuit boards of the type shown in FIGS. 19 and 20.

Turning now to FIG. 21, two circuits 84a and 84b which have been fabricated in accordance with the techniques shown in FIGS. 15-19 with cofired multilayer circuit 86 are stacked in the manner shown. Of course, any number of circuits may be stacked and registered with one another such that the selective areas of the noble metal layers from adjacent circuits 82, 90 align.

After the discrete circuit boards have been stacked up as shown in FIG. 21, the stack up is subjected to lamination under sufficient heat and pressure so as to adhere the fusible material 72 with adjacent ceramic material 26, 29 and diffuse the noble metal and thereby provide an integral and cohesive fused multilayer circuit board 88 (FIG. 22) having solid conductive interconnects.

Figure 22:
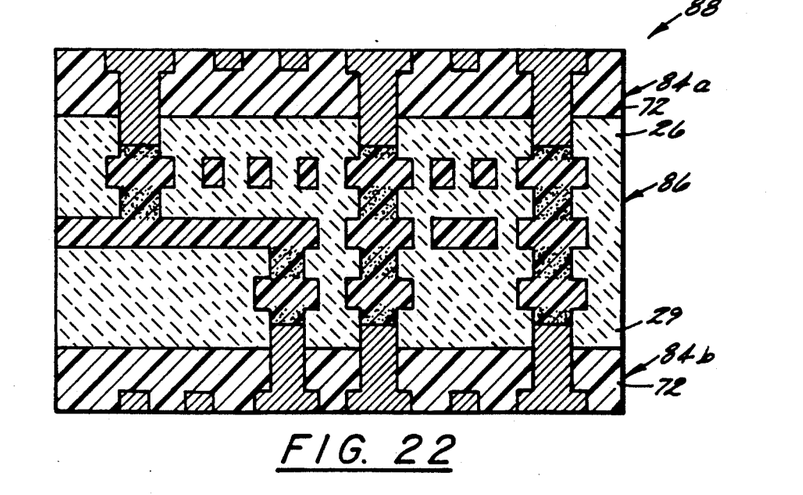
FIG. 22 is a cross sectional elevation view of a final laminated multilayer circuit board made in accordance with the third embodiment of the present invention.
Figure 23:
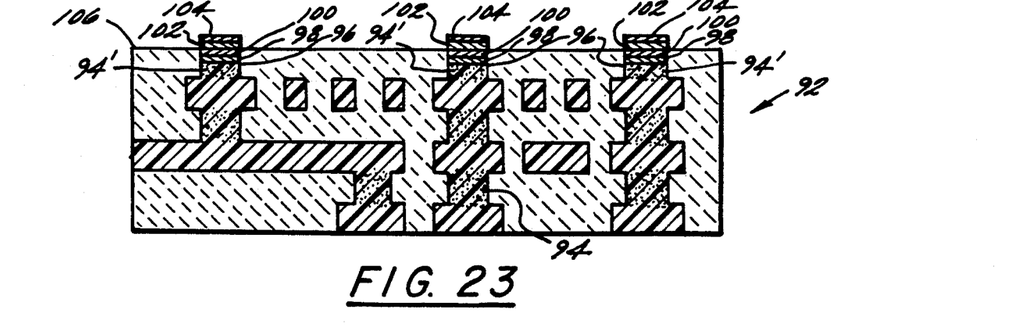
FIGS. 23-26 are cross sectional elevation views depicting a sequential fabrication technique for making multilayer circuit boards in accordance with the fourth embodiment of the present invention.
Figure 24:
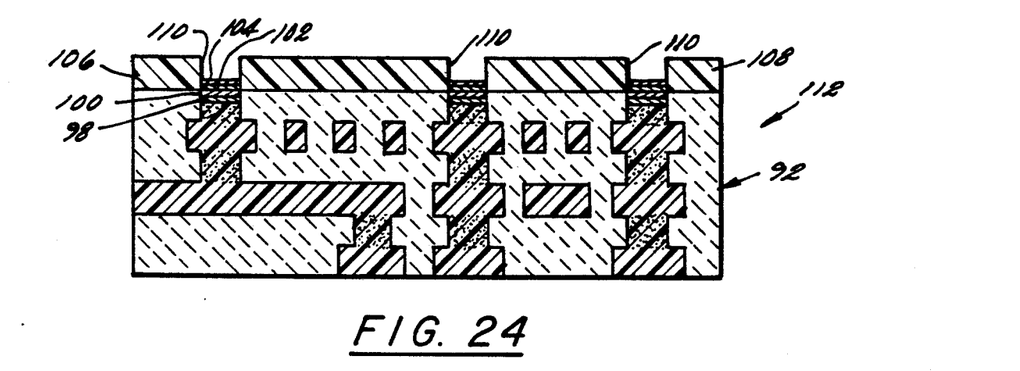

It will be appreciated that several alternative method steps may be utilized in conjunction with this embodiment of the invention. For example, rather than the additive processing techniques for formation of the circuit traces shown in FIGS. 15-19, known subtractive imaging technology may be used to form circuits 66. Also, the fusible interconnect material may be deposited by any known method such as screen printing or by using any other suitable selective placement technology. In addition, an intermediate bonding film having access openings selectively formed therein may be utilized between discrete circuit layers 84a and 84b. This intermediate bonding film would include the fusible conductive material therein so that upon lamination under heat and pressure, a final multilayer circuit such as shown in FIG. 22 would result. In still another alternative, the entire access opening 26 may be filled with the noble metal.

Turning now to FIGS. 23-26, a fourth embodiment in accordance with the present invention is shown. In this fourth embodiment, a first cofired multilayer ceramic circuit board shown generally at 92 is formed using any known processes. Ceramic circuit 92 includes a pattern of circuit traces and pads 94 therethrough. Exposed pads or vias 94' are comprised of a layer of chrome 96 deposited on the conductive ink (as described hereinbefore) within a recess 98 and a layer of conductive material 100 (e.g., copper) is deposited on the layer of chrome 96 also within recess 98. A layer 102 comprising nickel or equivalent is deposited on layer 98 and a layer 104 comprising a noble metal (e.g., gold) is deposited on layer 102. Layers 102 and 104 extend above a surface 106 of circuit 92. In the next step shown in FIG. 24, a layer of fusible dielectric material 108 is provided onto top surface 106 of circuit 92. Layer 108 will include preselected registered openings 110 therethrough which correspond to preselected locations 94' on circuit 92 resulting in the assembly identified at 112. Alternatively, layer 108 may be positioned over circuit 92 with openings 110 formed "in situ" using laser etching or other techniques.

Figure 25:
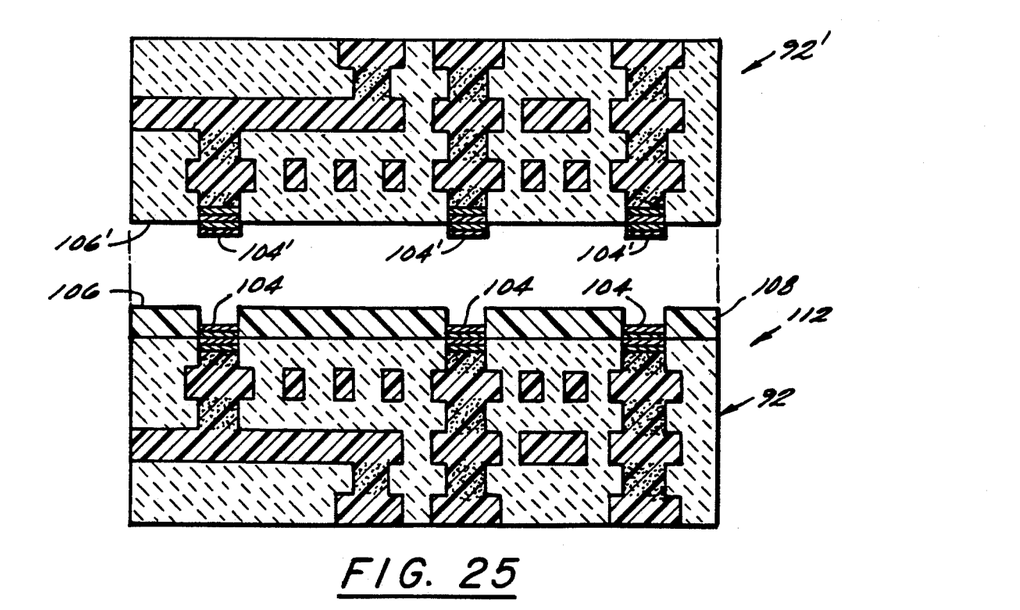
Figure 26:
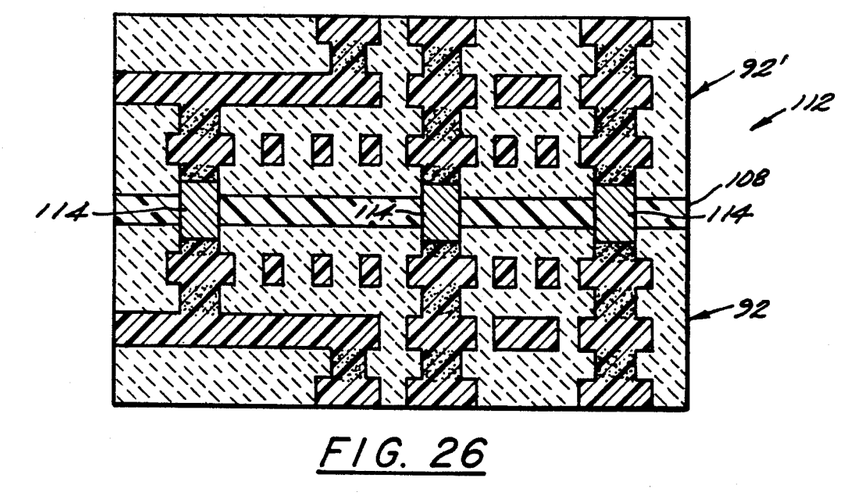

Next, as shown in FIG. 25, a second cofired multilayer ceramic circuit 92' is disposed over circuit assembly 112 such that layer 104' of gold of circuits 92' are aligned with layer 104 of gold of circuit 92. The stack-up in FIG. 25 is then subjected to fusion lamination as described above resulting in the diffusion of gold layer 54 and 54' of circuits 92 and 92', and the adhesion of dielectric layer 108 to surfaces 106, 106' of circuits 92, 92' provide a cohesive multilayer circuit board 112 having solid conductive interconnects 114 (see FIG. 26). It will be appreciated that as in the other embodiments, any number of circuits may be stacked to form any desired multilayer circuit configuration.

It will be appreciated that cofired multilayer ceramic circuits are typically used for power distribution, polymeric circuits are less suitable for power distribution. Also the ceramic adds rigidity and heat sinking to the circuit.

Figure 27:
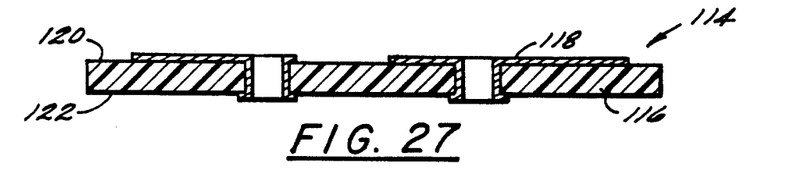
FIG. 27 is a cross-sectional elevational view of a polyimide circuit in accordance with the present invention.

Referring now to FIG. 27, a circuit board 114 having a polyimide substrate 116 and a pattern of circuit traces and pads 118 on at least one of its surfaces 120, 122 is presented. Circuit board 114 is preferably an non-fusing polyimide film with copper bonded thereto. One known method of forming circuit board 114 comprises the following: (1) drilling a hole pattern which corresponds to the desired vias in a polyimide film having a direct bond copper foil; (2) metallizing the holes; (3) electroplate the copper; (4) apply photo resist to define a desired circuit pattern; (5) develop plating channels; (6) plate with solder (alternatively, nickel and gold layers may be plated); and (7) chemically etch the circuit board (solder will not etch in a copper etch). Further, as is known, any other suitable method for forming the polyimide circuit may be employed (e.g., pattern plating).

Figures 28, 29:
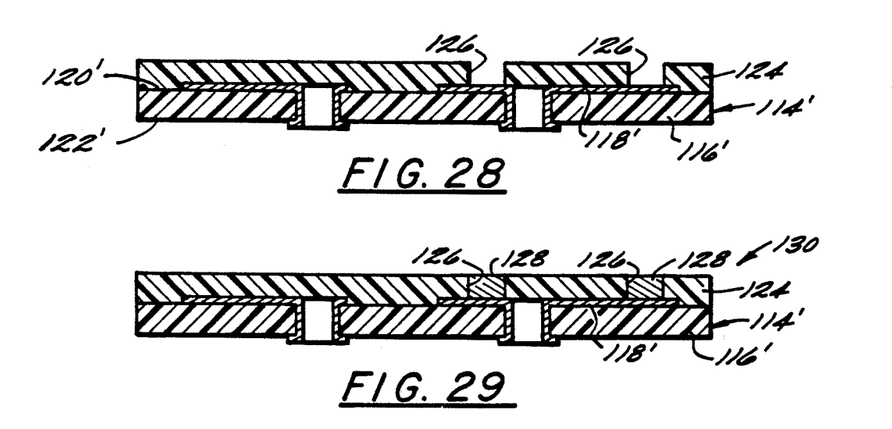
FIGS. 28-31 are cross sectional elevation views depicting a sequential fabrication technique for making multilayer circuit boards in accordance with the fifth embodiment of the present invention.

Referring now to FIGS. 28-31, a fifth embodiment in accordance with the present invention is shown. In this embodiment a first polyimide circuit board 114' of the type described with reference to FIG. 27 herein, has a polyimide substrate 116' and a pattern of circuit traces and pads 118' on at least one of its surfaces 120', 122'. A layer of fusible dielectric material 124 is provided onto top surface 120' of circuit 114'. Layer 124 will include preselected registered openings 126 therethrough which correspond to preselected locations on circuit traces 118'. Alternatively, layer 124 may be positioned over circuit 114' with openings 126 formed "in situ" using laser etching or other techniques. Thereafter, fusible conductive plugs 128 are loaded in openings 126 adjacent selected contacts and pads 118' (FIG. 29). Conductive plugs 128 may be positioned within openings 126 using any suitable manual or mechanical means resulting in the circuit assembly identified at 130 in FIG. 29.

Figure 30:
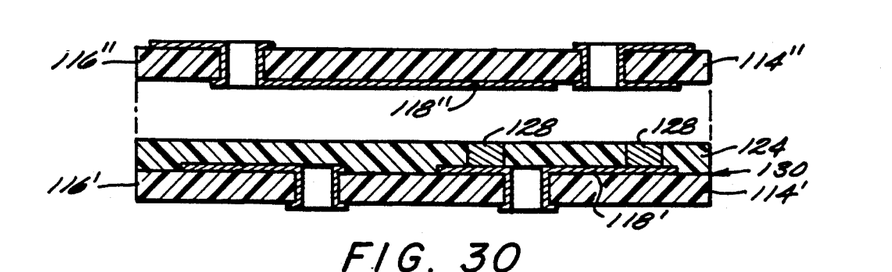
Figure 31:
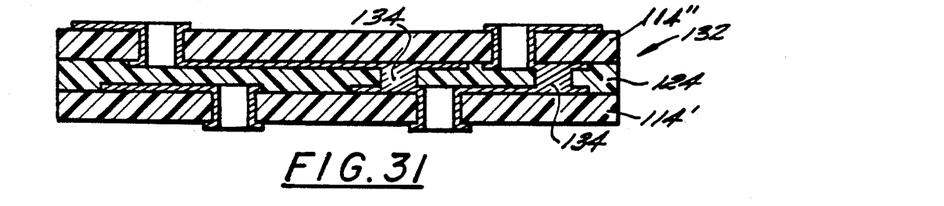
Figure 32:
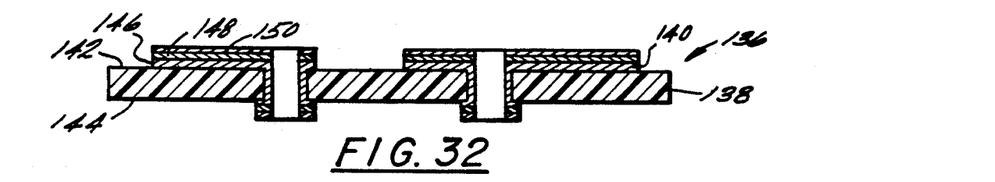
FIGS. 32-36 are cross sectional elevation views depicting a sequential fabrication technique for making multilayer circuit boards in accordance with the sixth embodiment of the present invention.
Figure 33:
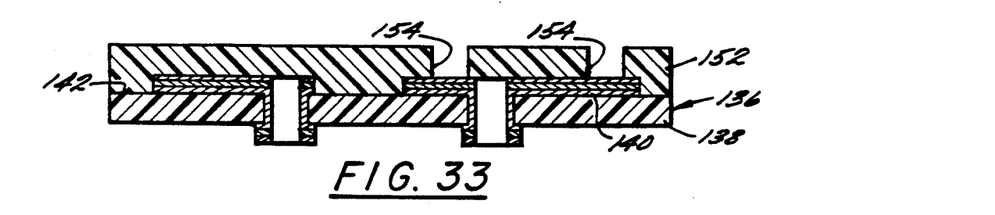

Next, and as shown in FIG. 30, a second circuit is disposed over circuit assembly 130 such that circuits 118" are aligned with and contact fusible conductive material 128. The stack-up in FIG. 30 is then subjected to fusion lamination as described above resulting in the fusion of conductive materials 128 with circuits 118 and 118" and the adhesion of dielectric layer 124 to polyimide layers 116' and 116" to provide a cohesive multilayer circuit board 132 having solid conductive interconnects 134 (see FIG. 31). It will be appreciated that as in the other embodiments, any number of circuits may be stacked to form any desired multilayer circuit configuration.

Figure 34:
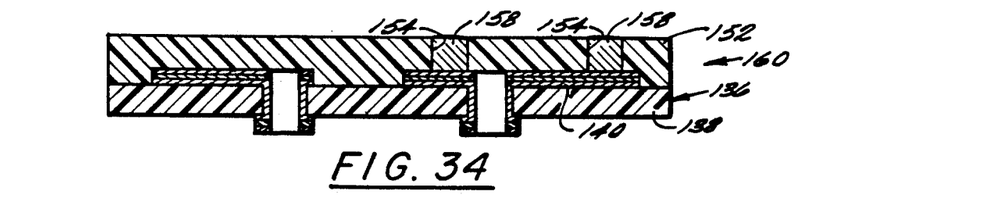

Turning now to FIGS. 32–36, a sixth embodiment in accordance with the present invention is shown. In this sixth embodiment, a circuit board shown generally at 136 is formed using any know processes. Circuit board 136 includes a polyimide substrate 138 and a pattern of circuit traces and pads 140 on surfaces 142, 144 of substrate 138. Circuit 140 is comprised of three layers; a first layer 146 comprises a suitable conductive material such as copper or aluminum which is deposited on substrate 138, a second layer 148 comprises nickel or equivalent which is deposited on layer 146 and a third layer 150 comprises a noble metal (e.g., gold) which is deposited on layer 148. In the next step shown in FIG. 33, a layer of fusible dielectric material 152 is provided onto top surface 142 of polyimide layer 138. Layer 152 will include preselected registered openings 154 therethrough which correspond to preselected locations on circuit traces 140 resulting in the assembly identified at 156. Alternatively, layer 152 may be positioned over circuit 136 with openings 154 formed "in situ" using laser etching or other techniques. Thereafter, noble metal plugs 158 are loaded in openings 154 adjacent selected contacts and pads 140 (FIG. 34). Plugs 158 may be positioned within openings 154 using any suitable manual or mechanical means resulting in the circuit assembly identified at 160 in FIG. 34.

Figure 35:
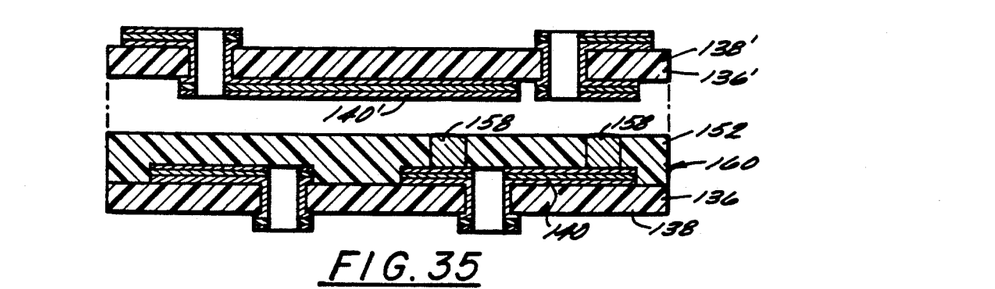
Figure 36:
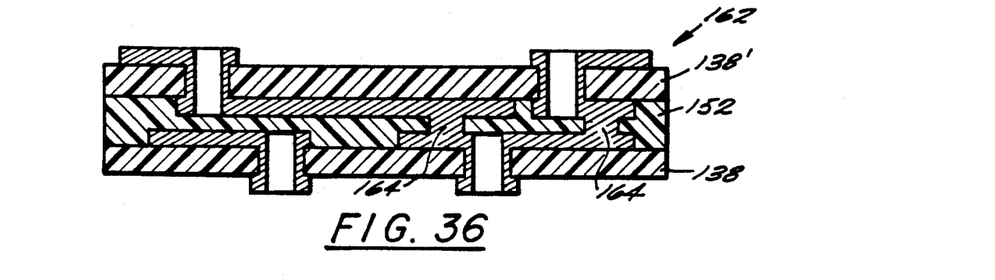

Next, as shown in FIG. 35, a second circuit 138' is disposed over circuit assembly 160 such that circuits 140' are aligned with and contact the noble metal plugs 158. The stack-up in FIG. 35 is then subjected to fusion lamination as described above resulting in the diffusion of gold layer 150' of circuit 136' and plugs 158, and the adhesion of dielectric layer 152 to polyimide layers 138 and 138' to provide a cohesive multilayer circuit board 162 having solid conductive interconnects 164 (see FIG. 36). It will be appreciated that as in the other embodiments, any number of circuits may be stacked to form any desired multilayer circuit configuration.

It will be appreciated that the non-fusing polyimide film is more suitable for wire bonding application than a fluoropolymer circuit. Rework of an integrated circuit which is bonded to a fluoropolymer circuit often results in damage to the circuit due to the softness of the fluoropolymer layer. However, rework of an integrated circuit which is bonded to a polyimide circuit does not damage the circuit because of the high modulus of the polyimide circuit.

It will be appreciated further that the polyimide dielectric of the fifth and sixth embodiments could be replaced with other high modulus, non-fusible polymer-based circuit dielectric with the same benefits.

For the embodiments of this invention, lamination temperatures and pressures will vary with the composition of fusible dielectric, solder and/or the noble metal.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making a multilayer circuit comprising the steps of:
   providing at least one first circuit board comprising a substrate of fusible dielectric material having opposing first and second surfaces, said first circuit board further comprising a first conductive circuit formed on said first surface, said first circuit including conductive material provided on at least one selected location thereof, said conductive material being exposed at said second surface;
   providing at least one second circuit board comprising a substrate of ceramic material and a second conductive circuit formed thereon;
   stacking said first and second circuit boards one on top of the other so that said conductive material exposed at said second surface of said first circuit board aligns with a selected location on said second circuit, said selected location on said second circuit or said conductive material exposed at said second surface of said first circuit board or both have a fusible conductive material disposed thereon; and
   laminating said stacked circuit boards under heat and pressure effective to adhere said fusible dielectric material to said ceramic material and to fuse said fusible conductive material so as to form a cohesive multilayer circuit having a solid conductive interconnect between said first and second circuits, said solid conductive interconnect being defined by said fusible conductive material.

2. The method of claim 1 wherein said first circuit board is formed by the steps of:
   forming said first conductive circuit;
   forming said fusible dielectric substrate having said opposed first and second surfaces, said first circuit being located on said first surface of said substrate;
   forming at least one access opening through said second surface of said substrate to expose said selected location on said first circuit; and
   filling said access opening with said conductive material wherein at least an upper portion of said filled access opening comprises said fusible conductive material.

3. The method of claim 2 wherein said conductive material at a lower portion of said access opening comprises non-fusible conductive material.

4. The method of claim 2 including the step of:
   forming said first circuit on a mandrel prior to forming said dielectric substrate on said circuit pattern.

5. The method of claim 4 including the step of:
   removing the mandrel subsequent to filling the access opening with conductive material.

6. The method of claim 2 wherein:
   said access opening is formed by at least one of the opening formation techniques selected from the group consisting of laser drilling, mechanical drilling, plasma etching and ion etching.

7. The method of claim 1 wherein:
   said fusible dielectric material comprises a fluoropolymeric material.

8. The method of claim 7 wherein:
   said fluoropolymeric material comprises a filled fluoropolymer.

9. The method of claim 7 wherein:
   said fluoropolymeric material comprises a polytetrafluoroethylene based material.

10. The method of claim 1 wherein:
said fusible conductive material comprises a metal or metal alloy.

11. The method of claim 10 wherein:
said fusible conductive material has a melting point of less than 900° F.

12. The method of claim 1 wherein said heat is in the temperature range of 620° to 800° F.

13. The method of claim 1 wherein:
said second circuit board comprises a cofired multilayer ceramic circuit board.

14. The method of claim 1 wherein:
said second circuit includes a layer of an adhesion promotor material on said selected location of said second circuit; and
a layer of a conductive material on said layer of said adhesion promotor material.

15. The method of claim 14 wherein:
said adhesion promotor material comprises chrome; and
said conductive material on said layer of said adhesion promotor material comprises copper.

16. A method of making a multilayer circuit comprising the steps of:
providing first and second circuit boards, each comprising a substrate of ceramic material and a conductive circuit formed thereon;
providing a sheet of fusible dielectric material;
forming a plug of fusible conductive material in said sheet of fusible conductive material;
stacking said first and second circuit boards with said sheet of fusible dielectric material sandwiched therebetween so that said plug of fusible conductive material aligns with a selected location on each of said circuits; and
laminating said stacked circuit boards under heat and pressure effective to adhere said fusible dielectric material to said ceramic material and to fuse said fusible conductive material so as to form a cohesive multilayer circuit having a solid conductive interconnect between said first and second circuits, said solid conductive interconnect being defined by said fusible conductive material.

17. The method of claim 16 wherein:
said fusible dielectric material comprises a fluoropolymeric material.

18. The method of claim 17 wherein:
said fluoropolymeric material comprises a filled fluoropolymer.

19. The method of claim 17 wherein:
said fluropolymeric material comprise a polytetrafluoroethylene based material.

20. The method of claim 16 wherein:
said fusible conductive material comprises a metal or metal alloy.

21. The method of claim 20 wherein:
said fusible conductive material has a melting point of less than 900° F.

22. The method of claim 16 wherein said heat is in the temperature range of 620° to 800° F.

23. The method of claim 16 wherein:
said first and second circuit boards each comprise a cofired multilayer ceramic circuit board.

24. The method of claim 16 wherein said first and second circuits each include:
a layer of an adhesion promotor material on said selected location of each of said first and second circuits; and
a layer of a conductive material on said layer of said adhesion promotor material.

25. The method of claim 24 wherein:
said adhesion promotor material comprises chrome; and
said conductive material on said layer of said adhesion promotor material comprises copper.

26. A method of making a multilayer circuit comprising the steps of:
providing at least one first circuit board comprising a substrate of fusible dielectric material having opposing first and second surfaces, said first circuit board further comprising a first conductive circuit formed on said first surface, said first circuit having conductive material provided on at least one selected location thereof, said conductive material being exposed at said second surface, said conductive material at said second surface having a layer of a noble metal disposed thereon;
providing at least one second circuit board comprising a substrate of ceramic material and a second conductive circuit formed thereon, said second conductive circuit including a layer of noble metal material on at least one selected location thereof;
stacking said first and second circuit boards one on top of the other so that said selected locations of noble metal on said first circuit board aligns with said selected locations of noble metal on said second circuit board; and
laminating said stacked circuit boards under heat and pressure effective to adhere said fusible dielectric material to said ceramic material and to diffuse said noble metal so as to form a cohesive multilayer circuit having a solid conductive interconnect between said first and second circuits, said solid conductive interconnect being defined by said noble metal.

27. The method of claim 26 wherein said first circuit board is formed by the steps of:
forming said first conductive circuit;
forming said fusible dielectric substrate having said opposed first and second surfaces, said first circuit being located on said first surface of said substrate;
forming at least one access opening through said second surface of said substrate to expose said selected location on said first circuit; and
filling said access opening with said conductive material wherein at least an upper portion of said filled access opening comprises said noble metal.

28. The method of claim 27 wherein said conductive material at a portion of said access opening comprises non-fusible conductive material.

29. The method of claim 27 including the step of:
forming said first circuit on a mandrel prior to forming said dielectric substrate on said circuit pattern.

30. The method of claim 29 including the step of:
removing the mandrel subsequent to filling the access opening with conductive material.

31. The method of claim 27 wherein:
said access opening is formed by at least one of the opening formation techniques selected from the group consisting of laser drilling, mechanical drilling, plasma etching, ion etching, punching, and using preformed posts to penetrate dielectric.

32. The method of claim 26 wherein:
said fusible dielectric material comprises a fluoropolymeric material.

33. The method of claim 32 wherein:

said fluoropolymeric material comprises a filled fluoropolymer.

34. The method of claim 32 wherein:
said fluoropolymeric material comprises a polytetrafluoroethylene based material.

35. The method of claim 26 wherein:
said noble metal comprises gold.

36. The method of claim 26 wherein said first circuit comprises at, at least said selected location:
a layer of copper;
a layer of nickel deposited on said layer of copper; and said layer of noble metal deposited on said layer of nickel; and
wherein said second circuit comprises at, at least said selected location
a layer of chrome;
a layer of copper deposited on said layer of chrome;
a layer of nickel deposited on said layer of copper; and
said layer of noble metal deposited on said layer of nickel.

37. The method of claim 26 wherein each of said first and second circuits comprise:
a layer of a conductive material; and
said layer of noble metal deposited on said layer of conductive material.

38. The method of claim 37 wherein said layer of conductive material comprises copper or aluminum.

39. The method of claim 26 wherein said first and second conductive circuits comprise a noble metal.

40. A method of making a multilayer circuit comprising the steps of:
providing first and second circuit boards, each comprising a substrate of ceramic material and a conductive circuit formed thereon, said conductive circuit including a layer of a noble metal material on at least one selected location thereof;
providing a sheet of fusible dielectric material having at least one opening therethrough;
stacking said first and second circuit boards with said sheet of fusible dielectric material sandwiched therebetween so that said noble metal on each of said first and second circuit boards align within said opening of said fusible dielectric material; and
laminating said stacked circuit boards under heat and pressure effective to adhere said fusible dielectric material to said ceramic material and to diffuse said noble metal so as to form a cohesive multilayer circuit having a solid conductive interconnect between said first and second circuits, said solid conductive interconnect being defined by said noble metal.

41. The method of claim 40 wherein:
said opening is formed by at least one of the opening formation techniques selected from the group consisting of laser drilling, mechanical drilling, plasma etching, ion etching, punching, and using preformed posts to penetrate dielectric.

42. The method of claim 40 wherein:
said fusible dielectric material comprises a fluoropolymeric material.

43. The method of claim 42 wherein:
said fluoropolymeric material comprises a filled fluoropolymer.

44. The method of claim 42 wherein:
said fluoropolymeric material comprises a polytetrafluoroethylene based material.

45. The method of claim 40 wherein:
said noble metal comprises gold.

46. The method of claim 40 wherein said first and second circuits each comprise at, at least said selected location:
a layer of chrome;
a layer of copper deposited on said layer of chrome;
a layer of nickel deposited on said layer of copper; and
said layer of noble metal deposited on said layer of nickel.

47. The method of claim 40 wherein each of said first and second circuits comprise:
a layer of a conductive material; and
said layer of noble metal deposited on said layer of conductive material.

48. The method of claim 40 wherein said layer of conductive material comprises copper or aluminum.

49. The method of claim 40 wherein said first and second conductive circuits comprise a noble metal.

* * * * *